(12) United States Patent
Moon et al.

(10) Patent No.: US 11,121,628 B2
(45) Date of Patent: Sep. 14, 2021

(54) SWITCH CONTROL CIRCUIT AND BUCK CONVERTER COMPRISING THE SAME

(71) Applicant: SEMICONDUCTOR COMPONENTS INDUSTRIES, LLC, Phoenix, AZ (US)

(72) Inventors: SangCheol Moon, Bucheon-si (KR); Gwanbon Koo, Sunnyvale, CA (US); Chenghao Jin, Bucheon-si (KR); Bonggeun Chung, Siheung-si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 215 days.

(21) Appl. No.: 16/351,279

(22) Filed: Mar. 12, 2019

(65) Prior Publication Data

US 2019/0214908 A1 Jul. 11, 2019

Related U.S. Application Data

(63) Continuation of application No. 15/196,409, filed on Jun. 29, 2016, now Pat. No. 10,277,128.

(Continued)

(51) Int. Cl.
*H02M 3/158* (2006.01)
*G01R 19/04* (2006.01)
(Continued)

(52) U.S. Cl.
CPC ............ *H02M 3/158* (2013.01); *G01R 19/04* (2013.01); *H02M 1/36* (2013.01); *H02M 1/44* (2013.01); *H02M 3/156* (2013.01); *H02M 7/04* (2013.01); *H02M 1/0003* (2021.05); *H02M 1/0009* (2021.05); *H02M 1/0022* (2021.05); *H02M 1/0025* (2021.05); *H02M 1/0048* (2021.05); *H02M 1/0054* (2021.05);
(Continued)

(58) Field of Classification Search
CPC ........ H02M 3/156; H02M 3/158; H02M 1/36; H02M 1/44; H02M 2001/0022; H02M 2001/0025; H02M 2001/0003; H02M 2001/0048; H02M 2001/0054; H02M 2001/0058; H02M 2001/0009; H02M 1/0083; H02M 7/217; G01R 19/04; Y02B 70/10
See application file for complete search history.

(56) References Cited

U.S. PATENT DOCUMENTS 6,650,550 B2  11/2003  Wittenbreder, Jr.
7,218,085 B2   5/2007  Abedinpour et al.
(Continued)

*Primary Examiner* — Emily P Pham
(74) *Attorney, Agent, or Firm* — AMPACC Law Group, PLLC

(57) ABSTRACT

A buck converter includes a power switch having a first end to receive an input voltage, a synchronous switch connected between a second end of the power switch and the ground, an inductor having a first end connected to the other end of the power switch, and a switch control circuit configured to turn off the synchronous switch when a zero voltage delay time passes after an inductor current flowing through the inductor reaches a predetermined reference value, calculate a dead time based on the input voltage and the zero voltage delay time, and turn on the power switch when the dead time passes following the turn-off time of the synchronous switch.

18 Claims, 8 Drawing Sheets

Related U.S. Application Data

(60) Provisional application No. 62/185,834, filed on Jun. 29, 2015.

(51) Int. Cl.
    *H02M 1/36*     (2007.01)
    *H02M 3/156*     (2006.01)
    *H02M 1/44*     (2007.01)
    *H02M 7/04*     (2006.01)
    *H02M 7/217*     (2006.01)
    *H02M 1/00*     (2006.01)

(52) U.S. Cl.
    CPC .......... *H02M 1/0058* (2021.05); *H02M 7/217* (2013.01); *Y02B 70/10* (2013.01)

(56) References Cited

U.S. PATENT DOCUMENTS

| | | | |
|---|---|---|---|
| 7,456,620 B2 * | 11/2008 | Maksimovic | H02M 3/1588 323/283 |
| 10,491,105 B1 * | 11/2019 | Cho | H02M 3/1588 |
| 2007/0013349 A1 | 1/2007 | Bassett | |
| 2012/0062201 A1 | 3/2012 | Hachiya et al. | |
| 2014/0286056 A1 | 9/2014 | Yoon et al. | |
| 2015/0188433 A1 | 7/2015 | Jiang et al. | |
| 2015/0263625 A1 | 9/2015 | Lee et al. | |
| 2015/0340952 A1 | 11/2015 | Manohar et al. | |
| 2015/0381035 A1 | 12/2015 | Torres et al. | |
| 2016/0087544 A1 | 3/2016 | Jin et al. | |
| 2016/0233771 A1 | 8/2016 | Chen et al. | |
| 2016/0308441 A1 | 10/2016 | Chen et al. | |

* cited by examiner

SWITCH CONTROL CIRCUIT AND BUCK CONVERTER COMPRISING THE SAME

CROSS-REFERENCE TO RELATED APPLICATIONS

This application is a continuation of U.S. application Ser. No. 15/196,409, filed Jun. 29, 2016, which claims the benefit of U.S. Provisional Application No. 62/185,834, filed on Jun. 29, 2015 with the United States Patent and Trademark Office, the entire contents of which are incorporated herein by reference.

BACKGROUND

(a) Technical Field

Embodiments relate to a switch control circuit for zero voltage switching and a buck converter including the same.

(b) Description of the Related Art

A buck converter includes a power switch that receives an input voltage and performs switching and an inductor and a capacitor that are connected to the power switch. A diode may be connected between the inductor and the ground to decrease a flowing inductor current while the power switch is turned off. The buck converter may include a switching device (hereinafter referred to as a synchronous switch) instead of a diode. The switching of the synchronous switch may be controlled in synchronization with the switching of the power switch.

In a conventional buck converter, a dead time between switch operations of the power switch and the synchronous switch may be fixed as a time period having a great margin. Then, zero voltage switching (hereinafter referred to as ZVS) of the power switch may not be achieved according to a change in an input voltage.

SUMMARY

The present invention is directed to providing a switch control circuit that may achieve zero voltage switching (ZVS) and a buck converter including the same.

According to an aspect of the present invention, there is provided a switch control circuit for a power switch and a synchronous switch that are connected to an inductor. The switch control circuit includes a comparator configured to compare a detection voltage for detecting an inductor current flowing through the inductor with a predetermined reference voltage, a delay unit configured to delay an output of the comparator by a zero voltage delay time, and a dead time calculation unit configured to calculate a dead time based on the zero voltage delay time and an input voltage that is input to the power switch. The switch control circuit may control a turn-off time of the synchronous switch according to an output of the delay unit and may turn on the power switch when the dead time passes following the turn-off time of the synchronous switch.

The zero voltage delay time may be constant, and the dead time calculation unit may calculate the dead time based on the zero voltage delay time, an ON time of the power switch, and an OFF time of the power switch. The dead time calculation unit may calculate the dead time by dividing the ON time by the OFF time and multiply the quotient by the zero voltage delay time.

The switch control circuit may further include a pin for setting the zero voltage delay time. The delay unit may set the zero voltage delay time according to a voltage that is input through the pin.

The switch control circuit may calculate the zero voltage delay time based on a delay time, an ON time of the power switch, and an OFF time of the power switch. The delay time may be determined by the inductor and parasitic capacitors of the power switch and the synchronous switch.

The dead time calculation unit may calculate the dead time using a switching cycle of the power switch, the OFF time, and the delay time.

The switch control circuit may further include a pin for setting the delay time. The dead time calculation unit may set the delay time according to a voltage that is input through the pin.

The dead time calculation unit may calculate the dead time by dividing the switching cycle by the OFF time and multiplying the quotient by the delay time.

The switch control circuit may further include a pin for setting the delay time, and the delay unit may set the delay time according to a voltage that is input through the pin. The dead time calculation unit may receive the delay time from the delay unit.

The switch control circuit may calculate the zero voltage delay time based on a result of adding the ON time and the OFF time of the power switch, dividing the sum by the ON time, and multiplying the quotient by the delay time.

According to another aspect of the present invention, there is provided a buck converter including a power switch having a first end to receive an input voltage, a synchronous switch connected between a second end of the power switch and ground, an inductor having a first end connected to a second end of the power switch, and a switch control circuit configured to turn off the synchronous switch when a zero voltage delay time passes after an inductor current flowing through the inductor reaches a predetermined reference value, calculate a dead time based on the input voltage and the zero voltage delay time, and turn on the power switch when the dead time passes following the turn-off time of the synchronous switch.

The zero voltage delay time may be constant, and the switch control circuit may calculate the dead time based on the zero voltage delay time, an ON time of the power switch, and an OFF time of the power switch.

The switch control circuit may calculate the dead time by dividing the ON time by the OFF time and multiplying the quotient by the zero voltage delay time to calculate the dead time.

The switch control circuit may include a pin to which a voltage for setting the zero voltage delay time is input.

The switch control circuit may calculate the zero voltage delay time based on a delay time, an ON time of the power switch, and an OFF time of the power switch. The delay time may be determined based on the inductor and parasitic capacitors of the power switch and the synchronous switch.

The switch control circuit may calculate the dead time based on a switching cycle of the power switch, the OFF time, and the delay time. The switch control circuit may include a pin for setting the delay time.

The switch control circuit may calculate the dead time by dividing the switching cycle by the OFF time and multiplying the quotient by the delay time.

The switch control circuit may calculate the zero voltage delay time based on a result of adding the ON time and the OFF time of the power switch, dividing the sum by the ON time, and multiplying the quotient by the delay time.

The present invention provides a switch control circuit that can achieve zero voltage switching (ZVS) and a buck converter including the same.

DETAILED DESCRIPTION OF THE EMBODIMENTS

Figure 1:
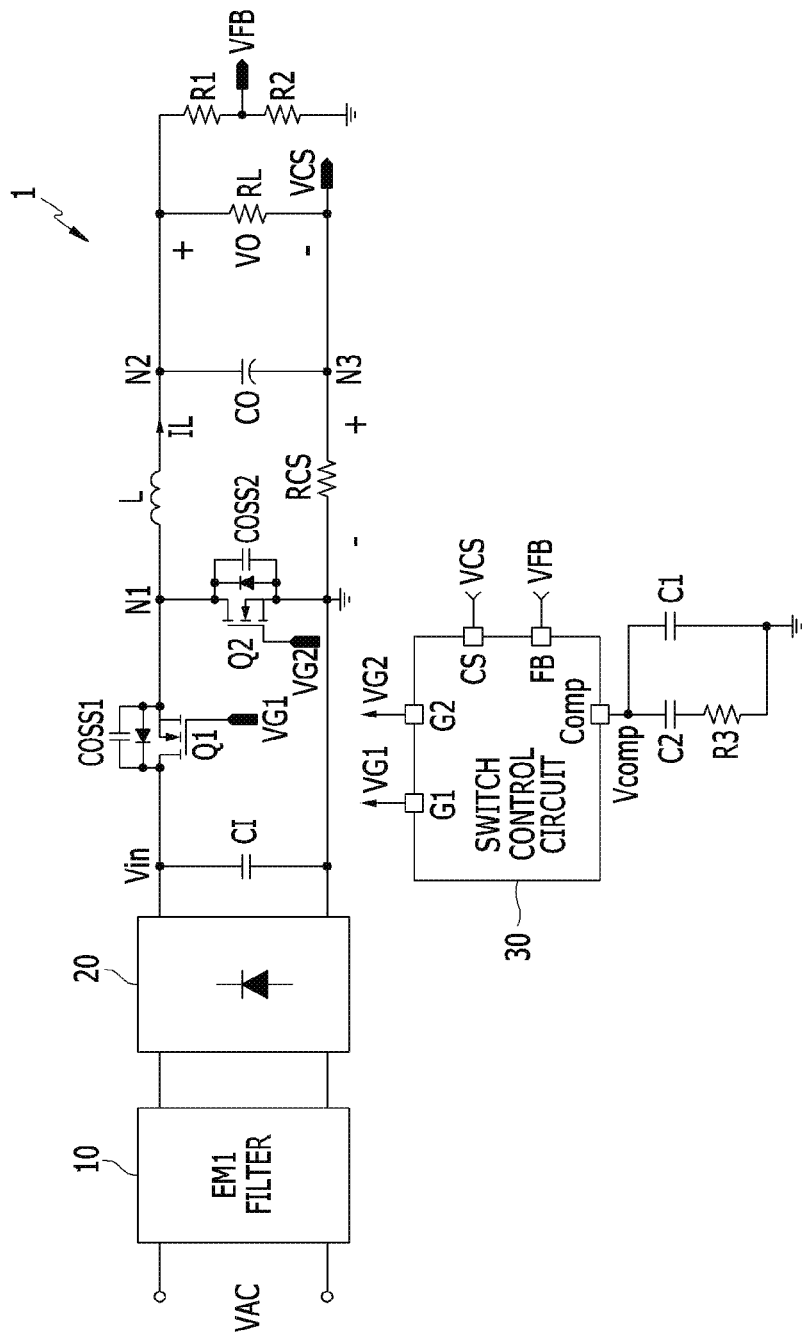
FIG. 1 is a diagram showing a buck converter according to an embodiment.

Hereinafter, exemplary embodiments will be described in detail with reference to the accompanying drawings so that they can be easily practiced by those skilled in the art to which the present invention pertains. The present invention may, however, be embodied in many different forms and should not be construed as being limited to the embodiments set forth herein. In the accompanying drawings, portions irrelevant to a description of the exemplary embodiments will be omitted for clarity. Moreover, like reference numerals refer to like elements throughout.

In this disclosure, when one part (or element, device, etc.) is referred to as being "connected" to another part (or element, device, etc.), it should be understood that the former can be "directly connected" to the latter, or "electrically connected" to the latter via an intervening part (or element, device, etc.). Furthermore, when one part is referred to as "comprising (or including or having)" other elements, it should be understood that it can comprise (or include or have) only those elements, or other elements as well as those elements unless specifically described otherwise.

According to an embodiment, a dead time between a turn-off time of a synchronous switch and an ON time of a power switch changes with a change in an alternating-current input. The alternating-current input is rectified to become a line input voltage, and the dead time may change according to the line input voltage. Hereinafter, embodiments of the present invention will be described with reference to the accompanying drawings.

FIG. 1 is a diagram showing a buck converter according to an embodiment.

As shown in FIG. 1, a buck converter 1 includes an electromagnetic interference (EMI) filter 10, a rectifier circuit 20, a power switch Q1, a synchronous switch Q2, and a switch control circuit 30.

The EMI filter 10 removes noise from an alternating-current input VAC, and the alternating-current input VAC is rectified to a line input voltage Vin through the rectifier circuit 20. Hereinafter, the line input voltage Vin is referred to as an input voltage.

A noise component of the input voltage Vin may be filtered out through a capacitor CI connected to the both ends of the rectifier circuit 20.

The input voltage Vin is input to a drain of the power switch Q1. A source of the power switch Q1 is connected to a node N1. A drain of the synchronous switch Q2 is connected to the node N1. A source of the synchronous switch Q2 is connected to the ground.

The power switch Q1 and the synchronous switch Q2 are each implemented as an n-channel type metal-oxide semiconductor field-effect transistor (MOSFET). A gate voltage VG1 and a gate voltage VG2 are input to a gate of the power switch Q1 and a gate of the synchronous switch Q2, respectively. The power switch Q1 and the synchronous switch Q2 are turned on when the gate voltage VG1 and the gate voltage VG2 are at a high level. The power switch Q1 and the synchronous switch Q2 are turned off when the gate voltage VG1 and the gate voltage VG2 are at a low level.

An inductor L is connected between the node N1 and a node N2. A capacitor CO is connected between the node N2 and a node N3. A resistor RCS is connected between the node N3 and the ground. An output voltage VO is a voltage across the capacitor CO and is supplied to a load RL.

The resistor RCS is a resistor for detecting an inductor current IL flowing through the inductor L. A voltage of the node N3 is determined according to the inductor current IL and the resistor RCS, and is hereinafter referred to as a detection voltage VCS. A resistor R1 and a resistor R2 are connected in series between the node N2 and the ground. The output voltage VO is divided by the resistor R1 and the resistor R2 to become a feedback voltage VFB.

During an ON time of the power switch Q1, the inductor current IL flowing through the inductor L also flows to the ground through the capacitor CO and the resistor RCS. When a predetermined dead time passes after the power switch Q1 is turned off, the synchronous switch Q2 is turned on. During an ON time of the synchronous switch Q2, the inductor current IL decreases while flowing through the synchronous switch Q2, the inductor L, the capacitor CO, and the resistor RCS.

When a delay for zero voltage switching (i.e., a zero voltage delay time) passes after the inductor current IL becomes a zero current, the synchronous switch Q2 is turned off. Then, when a predetermined dead time passes, the power switch Q1 is turned on. The zero voltage delay time may be set as a constant value or may be calculated. For example, the switch control circuit 30 may calculate a zero voltage delay time at which a voltage across the power switch Q1 becomes a zero voltage because a parasitic capacitor COSS1 is discharged due to a negative inductor current IL. In detail, the switch control circuit 30 may calculate the zero voltage delay time using an ON time and an OFF time of the power switch Q1.

During the zero voltage delay time, an inductor current IL flowing in a negative direction (i.e., a direction opposite to the arrow direction of the inductor current shown in FIG. 1) increases. After the synchronous switch Q2 is turned off, a negative inductor current IL decreases and reaches a zero current.

While the negative inductor current IL flows after the synchronous switch Q2 is turned off, the zero voltage switching is possible when the power switch Q1 is turned on. The switch control circuit 30 according to an embodiment calculates the dead time on the basis of the zero voltage delay time. Then, after the synchronous switch Q2 is turned off and before the inductor current IL reaches a zero current, the power switch Q1 may be turned on.

The switch control circuit 30 delays the turn-off time of the synchronous switch Q2 by the zero voltage delay time. As the turn-off time of the synchronous switch Q2 is delayed, a turn-on time of the power switch Q1 is also delayed. Then, the parasitic capacitor COSS1 is discharged due to a negative inductor current IL. Thus, the voltage across the power switch Q1 may reach a zero voltage. In this case, a parasitic capacitor COSS2 is charged due to the negative inductor current IL.

The feedback voltage VFB and the detection voltage VCS are input through a feedback pin FB and a detection pin CS of the switch control circuit 30, respectively. The gate voltage VG1 and the gate voltage VG2 are output through gate pins G1 and G2, respectively. A capacitor C1 is connected between a compensation pin COMP of the switch control circuit 30 and the ground. A capacitor C2 and a resistor R3 are connected in series between the compensation pin COMP and the ground.

The switch control circuit 30 generates the gate voltages VG1 and VG2 that control switching operations of the power switch Q1 and the synchronous switch Q2 using the feedback voltage VFB, a comparison voltage VCOMP corresponding to the feedback voltage VFB, and the detection voltage VCS.

Figure 2:
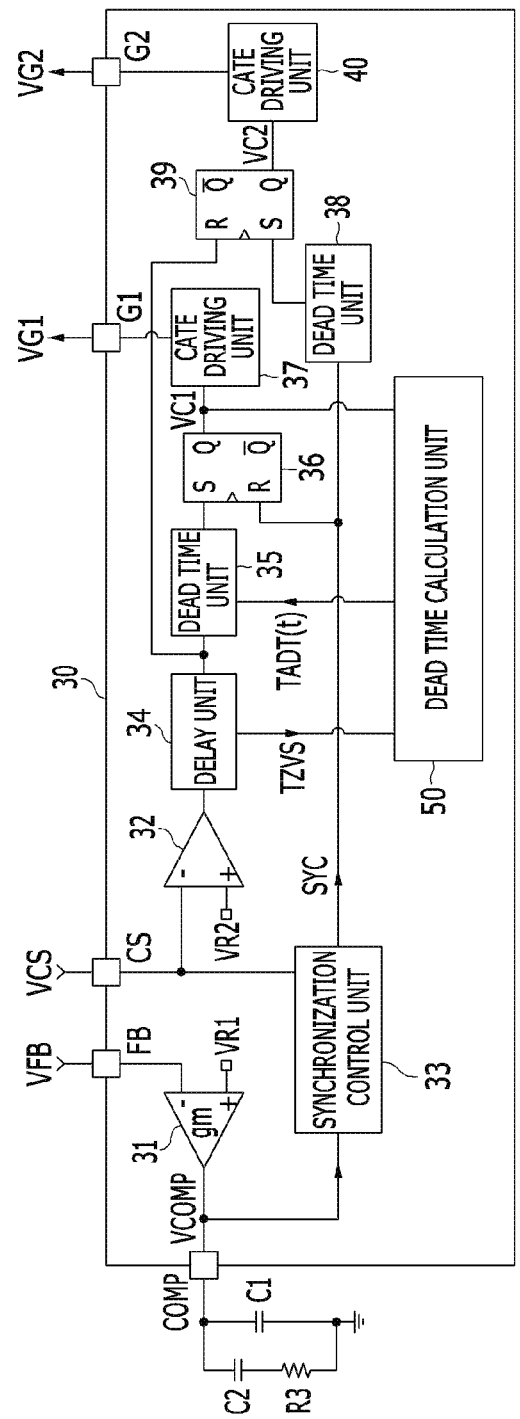
FIG. 2 is a diagram showing a switch control circuit according to an embodiment.

FIG. 2 is a diagram showing a switch control circuit according to an embodiment.

As shown in FIG. 2, the switch control circuit 30 includes an operational amplifier 31, a comparator 32, a synchronization control unit 33, a delay unit 34, two dead time units 35 and 38, two SR flip-flops 36 and 39, two gate driving units 37 and 40, and a dead time calculation unit 50.

The operational amplifier 31 amplifies and outputs a difference between a reference voltage VR1 and the feedback voltage VFB. The comparison voltage VCOMP is generated by the capacitors C1 and C2 and the resistor R3 by performing frequency gain compensation on an output of the operational amplifier 31.

The synchronization control unit 33 outputs a synchronization signal SYC for controlling switching according to any one of peak current mode control and voltage mode control. According to the synchronization signal SYC, the power switch Q1 may be turned off, and the synchronous switch Q2 may be turned on.

The synchronization control unit 33 may generate the synchronization signal SYC on the basis of a result of comparing the comparison voltage VCOMP and the detection voltage VCS according to the peak current mode control. Alternatively, the synchronization control unit 33 may generate the synchronization signal SYC on the basis of a result of comparing the comparison voltage VCOMP and a predetermined signal synchronized with a switching frequency according to the voltage mode control. In this case, the predetermined signal synchronized with the switching frequency may have a saw-tooth waveform that increases during one switching cycle of the power switch Q1 after the turn-on time of the power switch Q1.

The comparator 32 outputs a result obtained by comparing the detection voltage VCS and a reference voltage VR2. The detection voltage VCS is input to an inverting terminal (−) of the comparator 32. The reference voltage VR2 is input to a non-inverting terminal (+) of the comparator 32. The comparator 32 outputs a high level when the input of the non-inverting terminal (+) is equal to or greater than the input of the inverting terminal (−). Otherwise, the comparator 32 outputs a low level.

The delay unit 34 delays an output of the comparator 32 by a zero voltage delay time TZVS. The zero voltage delay time TZVS may be set in the delay unit 34.

The dead time unit 35 delays an output of the delay unit 34 by a dead time TADT(t).

The SR flip-flop 36 raises a gate control signal VC1 to a high level according to an input of a set terminal S and lowers the gate control signal VC1 to a low level according to an input of a reset terminal R. An output of the dead time unit 35 is input to the set terminal S of the SR flip-flop 36. An output of the synchronization control unit 33 is input to the reset terminal R of the SR flip-flop 36. An output terminal Q of the SR flip-flop 36 is connected to the dead time calculation unit 50 and the gate driving unit 37.

The gate driving unit 37 generates the gate voltage VG1 according to the gate control signal VC1. For example, the gate driving unit 37 generates a high-level gate voltage VG1 according to a high-level gate control signal VC1 and generates a low-level gate voltage VG1 according to a low-level gate control signal VC1.

The dead time unit 38 delays the synchronization signal SYC by a predetermined dead time.

The SR flip-flop 39 raises a gate control signal VC2 to a high level according to an input of the set terminal S and lowers the gate control signal VC2 to a low level according to an input of the reset terminal R. An output of the dead time unit 38 is input to the set terminal S of the SR flip-flop 39. An output of the delay unit 34 is input to the reset terminal R of the SR flip-flop 39. An output terminal Q of the SR flip-flop 39 is connected to the gate driving unit 40.

The gate driving unit 40 generates the gate voltage VG2 according to the gate control signal VC2. For example, the gate driving unit 40 generates a high-level gate voltage VG2 according to a high-level gate control signal VC2 and generates a low-level gate voltage VG2 according to a low-level gate control signal VC2.

The dead time calculation unit 50 calculates the dead time TADT(t) on the basis of an ON time and an OFF time of the power switch Q1 and the zero voltage delay time TZVS. For example, the dead time TADT(t) may be calculated by dividing an ON time Ton(t) by an OFF time Toff(t) and multiplying the quotient by the zero voltage delay time TZVS.

Figure 3:
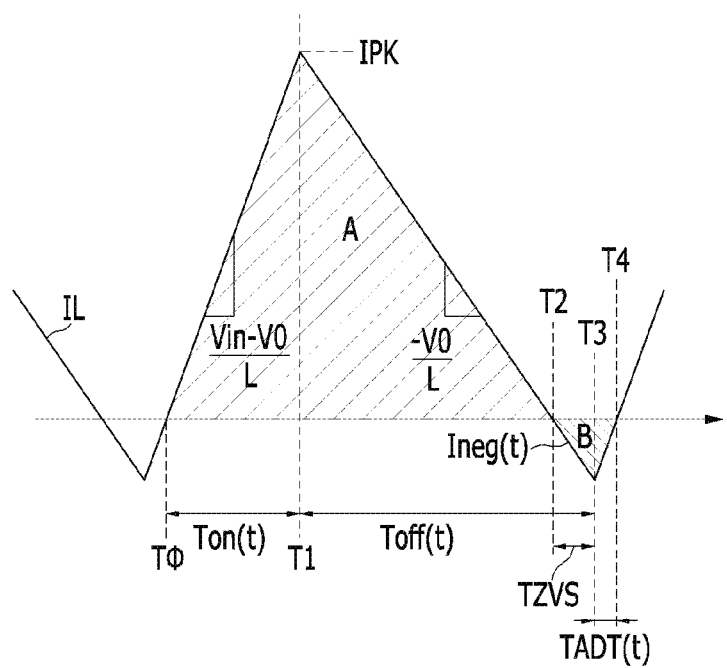
FIG. 3 is a waveform chart showing an inductor current according to an embodiment.

FIG. 3 is a waveform chart showing an inductor current according to an embodiment.

In FIG. 3, it will be described that the power switch Q1 is turned on immediately before time T0 at which the inductor current IL intersects with a zero current. During the ON time Ton(t) of the power switch Q1, the inductor current IL increases with a slope of (Vin−VO)/L. Vin is an input voltage, VO is an output voltage, and L is an inductance of the inductor L.

The power switch Q1 is turned off at time T1, and the synchronous switch Q2 is turned on after the predetermined dead time. During the OFF time Toff(t) of the power switch Q1, the inductor current IL decreases with the slope of VO/L. In FIG. 3, the decreasing slope is shown as −VO/L.

The ON time and the OFF time of the power switch Q1 may change over time, and thus are expressed as Ton(t) and Toff(t), respectively. Ton(t) is an ON time in one s itching cycle of the power switch Q1, and Toff(t) is an OFF time in one switching cycle of the power switch Q1.

As shown in FIG. 3, triangle A represented as oblique lines "/" and triangle B represented as oblique lines "\" are substantially similar to each other. Then, a ratio of the ON time Ton(t) to a time period T1-T2 is equal to a ratio of the dead time TADT(t) to the zero voltage delay time TZVS.

The time period T1-T2 may be represented as a time period of subtracting the zero voltage delay time TZVS from the OFF time Toff(t). By summarizing this, the following Equation 1 is obtained.

$$Ton(t):Toff(t)-TZVS(t)=TADT(t):TZVS(t). \quad \text{[Equation 1]}$$

By performing rearrangement with respect to the dead time TADT(t), the following Equation 2 is obtained.

$$TADT(t) = TZVS \cdot \frac{Ton(t)}{Toff(t) - TZVS} \cong TZVS \cdot \frac{Ton(t)}{Toff(t)}. \quad \text{[Equation 2]}$$

The zero voltage delay time TZVS is a very short time, compared to the OFF time Toff(t). Toff(t)-TZVS may be substantially the same as Toff(t). Accordingly, the zero voltage delay time TZVS may be represented as the rightmost term of Equation 2.

The dead time calculation unit 50 may calculate the dead time TADT(t) on the basis of Equation 2.

Figure 4:
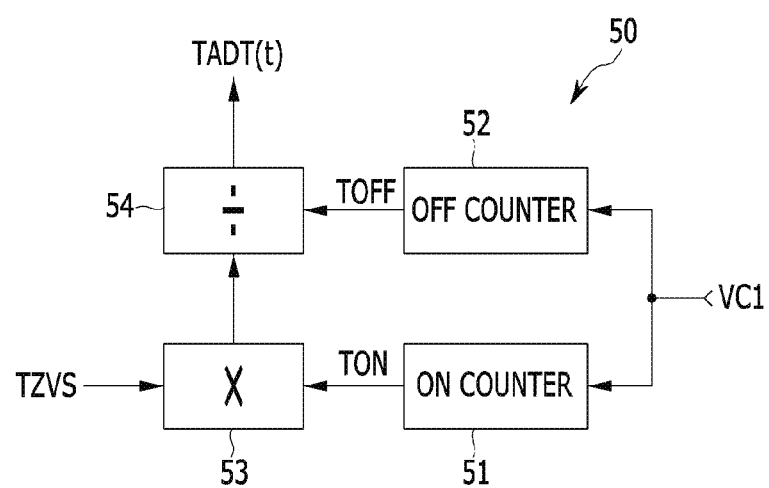
FIG. 4 is a diagram showing a dead time calculation unit according to an embodiment.

FIG. 4 is a diagram showing a dead time calculation unit according to an embodiment.

As shown in FIG. 4, the dead time calculation unit 50 includes an ON counter 51, an OFF counter 52, a multiplier 53, and a divider 54.

The ON counter 51 counts an ON time of the power switch Q1 using the gate control signal VC1 and generates an ON count signal TON on the basis of a result of the counting. The OFF counter 52 counts an OFF time of the power switch Q1 using the gate control signal VC2 and generates an OFF count signal TOFF on the basis of a result of the counting.

The multiplier 53 receives the zero voltage delay time TZVS and the ON count signal TON and calculates a result of multiplying the zero voltage delay time TZVS and an ON time Ton(t) that is based on the ON count signal TON.

The divider 54 receives a result of the multiplication from the multiplier 53 and divides the multiplication result by an OFF time Toff(t) that is based on the OFF count signal TOFF to calculate the dead time TADT(t).

As described above, the dead time TADT(t) depends on the quotient of the OFF time Toff(t) by the ON time Ton(t). When the output voltage VO of the buck converter 1 is regulated to be constant, the ratio between the OFF time Toff(t) and the ON time Ton(t) is determined according to the input voltage Vin. Accordingly, the dead time TADT(t) changes depending on the input voltage Vin.

The zero voltage delay time TZVS may be set as a constant value in the switch control circuit 30. However, the present invention is not limited thereto. The zero voltage delay time TZVS may be set as a constant value through an external pin of the switch control circuit 30.

Figure 5:
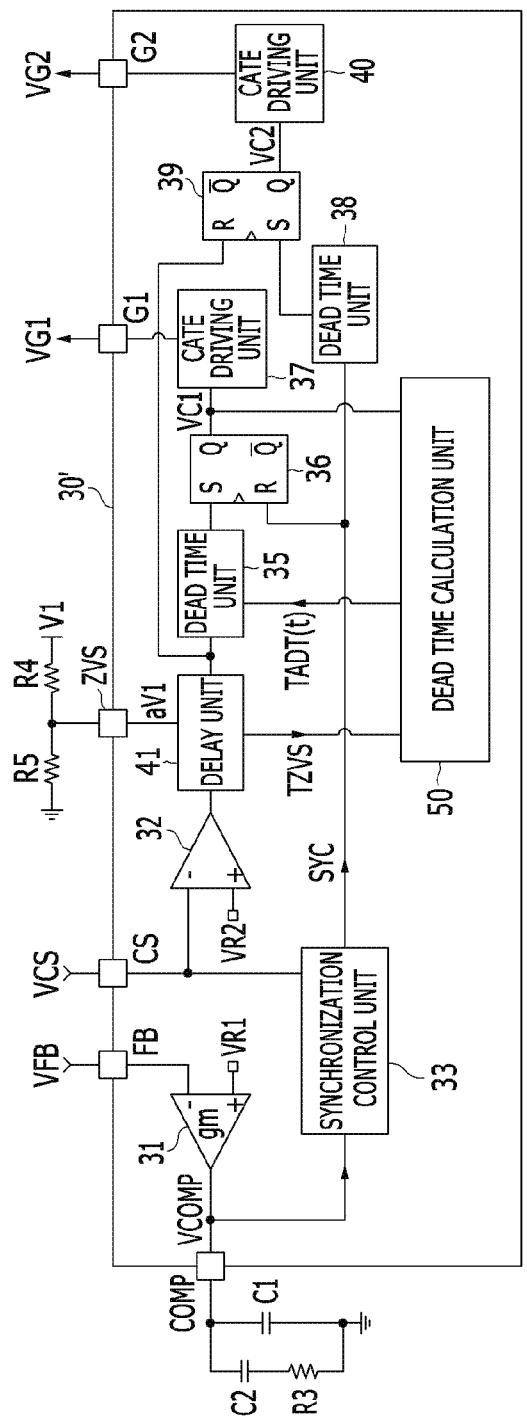
FIG. 5 is a diagram showing a switch control circuit according to another embodiment.

FIG. 5 is a diagram showing a switch control circuit according to another embodiment.

The same reference numerals are used for the same elements as those in the above-described embodiment, and descriptions thereof will be omitted.

As shown in FIG. 5, a switch control circuit 30' further includes a pin ZVS for setting the zero voltage delay time TZVS from the outside. A resistor R4 and a resistor R5 are connected in series between a voltage V1 and the ground. The pin ZVS is connected to a node to which the two resistors R4 and R5 are connected.

Then, the voltage V1 is divided by the resistor R4 and the resistor R5 and is input to a delay unit 41. The delay unit 41 sets the zero voltage delay time TZVS that is based on a voltage aV1 input through the pin ZVS. The zero voltage delay time TZVS is input to the dead time calculation unit 50.

The dead time calculation unit 50 may calculate the dead time TADT(t) using the same method as that described in the above embodiment.

The zero voltage delay time TZVS may be set as a constant value in the switch control circuit 30' or may be set by an input from the outside of the switch control circuit 30'.

Unlike this, the zero voltage delay time TZVS(t) may be calculated, and also the dead time TADT(t) may be calculated on the basis of the calculated zero voltage delay time TZVS(t).

An example in which the zero voltage delay time TZVS(t) is calculated will be described as follows.

Referring to FIG. 3, the inductor current IL flows in a negative direction during the zero voltage delay time TZVS. The inductor current IL during the zero voltage delay time TZVS is expressed as Ineg(t). The zero voltage delay time TZVS may change over time, and thus is expressed as TZVS(t).

Due to a negative inductor current Ineg(t) during the zero voltage delay time TZVS(t), the parasitic capacitor COSS1 of the power switch Q1 is discharged, and the parasitic capacitor COSS2 of the synchronous switch Q2 is charged.

For ZVS, the zero voltage delay time TZVS(t) needs to be set such that energy caused by the negative inductor current IL is equal to the sum of energy discharged from the parasitic capacitor COSS1 and energy charged by the parasitic capacitor COSS2. When the zero voltage delay time TZVS (t) is shorter than a required time, the ZVS cannot be accomplished. When the zero voltage delay time TZVS(t) is longer than the required time, conduction loss may occur.

On the assumption that a peak current IPK is much higher than the negative inductor current IL, a relationship between the energy $L \cdot Ineg(t)^2/2$ supplied by the negative inductor current IL and the discharged energy $COSS1 \cdot VDS1(t)^2/2$ of the parasitic capacitor COSS1 and the charged energy $COSS2 \cdot VDS2(t)^2/2$ of the parasitic capacitor COSS2 may be expressed as Equation 3 below. COSS1 and COSS2 are capacitances of the capacitors.

$$L \cdot Ineg(t)^2 = COSS1 \cdot VDS1(t)^2 + COSS2 \cdot VDS2(t)^2 \quad \text{[Equation 3]}$$

where VDS1(t) is a voltage of the parasitic capacitor COSS1 during the zero voltage delay time TZVS(t), and VDS2(t) is a voltage of the parasitic capacitor COSS2. During the zero voltage delay time TZVS(t), the parasitic capacitor COSS1 is discharged from the input voltage Vin to a zero voltage, and the parasitic capacitor COSS2 is charged from a zero voltage to the input voltage Vin. Thus, $VDS1(t)^2$ and $VDS2(t)^2$ may be expressed as the square of the input voltage Vin. Then, the right side of Equation 1 may be expressed as $C*Vin^2$, and C is the sum of COSS1 and COSS2.

During the zero voltage delay time TZVS(t), Ineg(t) may be expressed as $(VO/L)*TZVS(t)$. The following Equation 4 is obtained by applying this to Equation 3 and performing rearrangement.

$$\frac{VO^2}{L} \cdot TZVS(t)^2 = C \cdot Vin^2. \quad \text{[Equation 4]}$$

A duty ratio $$\frac{Ton(t)}{Ton(t) + Toff(t)}$$

that is obtained by dividing the ON time Ton(t) of the power switch Q1 by a switching cycle is based on a ratio of the output voltage VO to the input voltage Vin (VO/Vin). Then, the input voltage Yin may be expressed as $$\frac{Ton(t) + Toff(t)}{Ton(t)} VO.$$

The following Equation 5 is obtained by substituting this to Equation 2 and performing rearrangement with respect to the zero voltage delay time TZVS(t).

$$TZVS(t) = \sqrt{LC} \cdot \frac{Ton(t) + Toff(t)}{Ton(t)}. \quad \text{[Equation 5]}$$

An LC value is a fixed value that is determined by the inductor L and the parasitic capacitors COSS1 and COSS2, and $\sqrt{LC}$ is a constant delay time Td. Accordingly, the zero voltage delay time TZVS(t) is determined according to $$\frac{Ton(t) + Toff(t)}{Ton(t)}$$

of the power switch Q1. A switch control circuit according to still another embodiment may calculate $$\frac{Ton(t) + Toff(t)}{Ton(t)}$$

and may multiply the calculated result by the delay time Td to calculate the zero voltage delay time TZVS(t).

A scheme of calculating the zero voltage delay time TZVS(t) is not limited thereto, and may be calculated in various manners.

When Equation 5 is substituted to Equation 3, the dead time TADT(t) may be expressed as Equation 6 below.

$$TADT(t) = Td \cdot \frac{Ton(t) + Toff(t)}{Toff(t)} = Td \cdot \frac{Ts(t)}{Toff(t)}. \quad \text{[Equation 6]}$$

As described above, a dead time calculation unit according to still another embodiment may calculate the dead time TADT(t) using the delay time Td, the ON time Ton(t), and the OFF time Toff(t) on the basis of Equation 6, without information regarding the zero voltage delay time. In addition, since the ON time Ton(t) and the OFF time Toff(t) correspond to a switching cycle Ts(t) of the power switch Q1, the dead time TADT(t) may be represented as the rightmost term of Equation 6.

Information regarding the delay time Id may be set in the switch control circuit. However, the present invention is not limited thereto. The information regarding the delay time may be set according to a voltage value that is input through an external pin.

Figure 6:
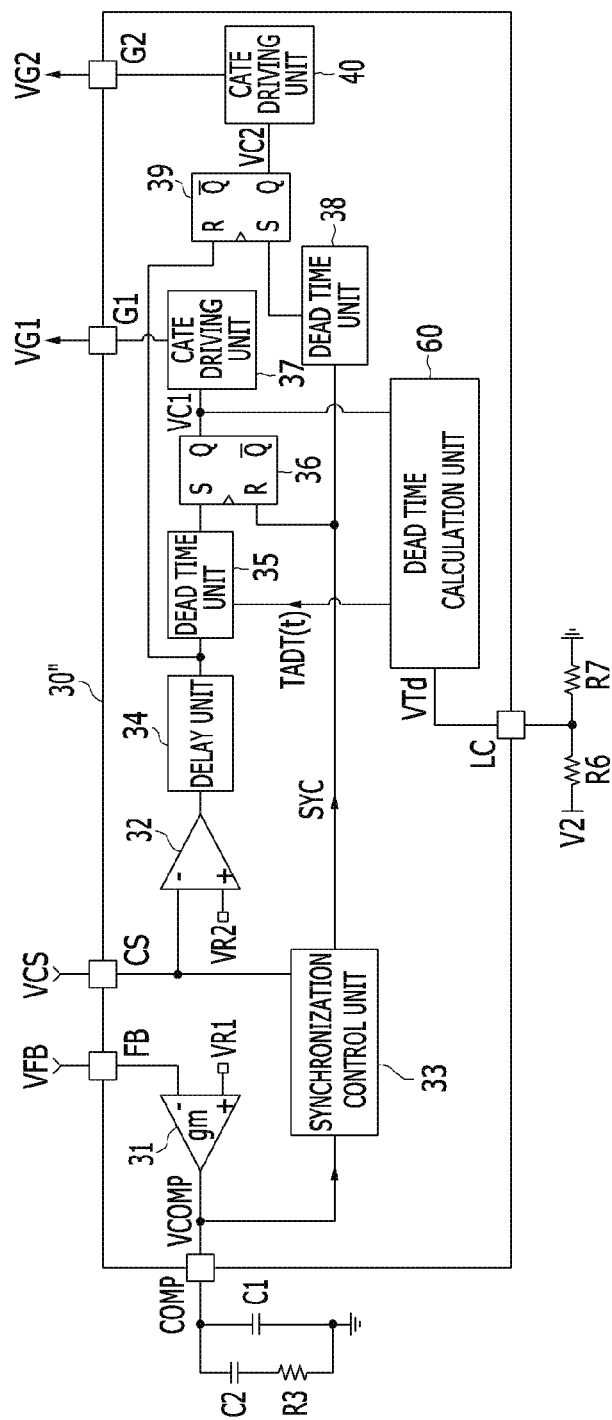
FIG. 6 is a diagram showing a switch control circuit according to still another embodiment.

FIG. 6 is a diagram showing a switch control circuit according to still another embodiment.

The same reference numerals are used for the same elements as those in the above-described embodiment, and descriptions thereof will be omitted.

As shown in FIG. 6, a switch control circuit 30" further includes a pin LC for setting the delay time Td from the outside. A resistor R6 and a resistor R7 are connected in series between a voltage V2 and the ground. The pin LC is connected to a node to which the two resistors R6 and R7 are connected.

Then, the voltage V2 is divided by the resistor R6 and the resistor R7 and is input to a dead time calculation unit 60. The dead time calculation unit 60 sets the delay time Td that is based on a voltage VTd input through the pin LC. The dead time calculation unit 60 adds the ON time Ton(t) (or the switching cycle Ts(t)) and the OFF time Toff(t), divides the sum by the OFF time Toff(t), and multiplies the quotient by the set delay time Td to calculate the dead time TADT(t).

Figure 7:
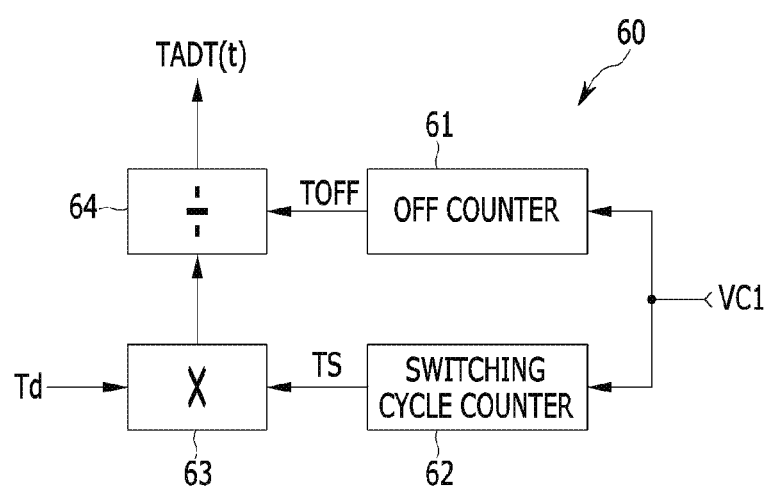
FIG. 7 is a diagram showing a dead time calculation unit according to still another embodiment.

FIG. 7 is a diagram showing a dead time calculation unit according to still another embodiment.

As shown in FIG. 7, the dead time calculation unit 60 includes an OFF counter 61, a switching cycle counter 62, a multiplier 63, and a divider 64.

The OFF counter 61 counts an OFF time of the power switch Q1 using the gate control signal VC1 and generates an OFF count signal TOFF based on a result of the counting. The switching cycle counter 62 counts a switching cycle of the power switch Q1 using the gate control signal VC1 and generates a switching cycle count signal TS based on a result of the counting.

The multiplier 63 receives the delay time Td and the switching cycle count signal TS and calculates a result of multiplying the delay time Td and a switching cycle Ts(t) that is based on the switching cycle count signal TS.

The divider 64 receives a product from the multiplier 63 and divides the product by the OFF time Toff(t) that is based on the OFF count signal TOFF to calculate the dead time TADT(t).

As described above, the dead time TADT(t) depends on the quotient of the switching cycle Ts(t) by the OFF time Toff(t). When the output voltage VO of the buck converter 1 is regulated to be constant, the ratio between the switching cycle Ts(t) and the OFF time Toff(t) is determined according to the input voltage Vin. Accordingly, the dead time TADT(t) changes depending on the input voltage Vin.

According to Equation 5, information regarding the delay time Td is needed to calculate the zero voltage delay time TZVS(t). Accordingly, the pin LC for setting the delay time Td may be connected to an element for calculating the zero voltage delay time TZVS(t).

That is, the delay time Td may be transferred from the element for calculating the zero voltage delay time TZVS(t) to the dead time calculation unit.

Figure 8:
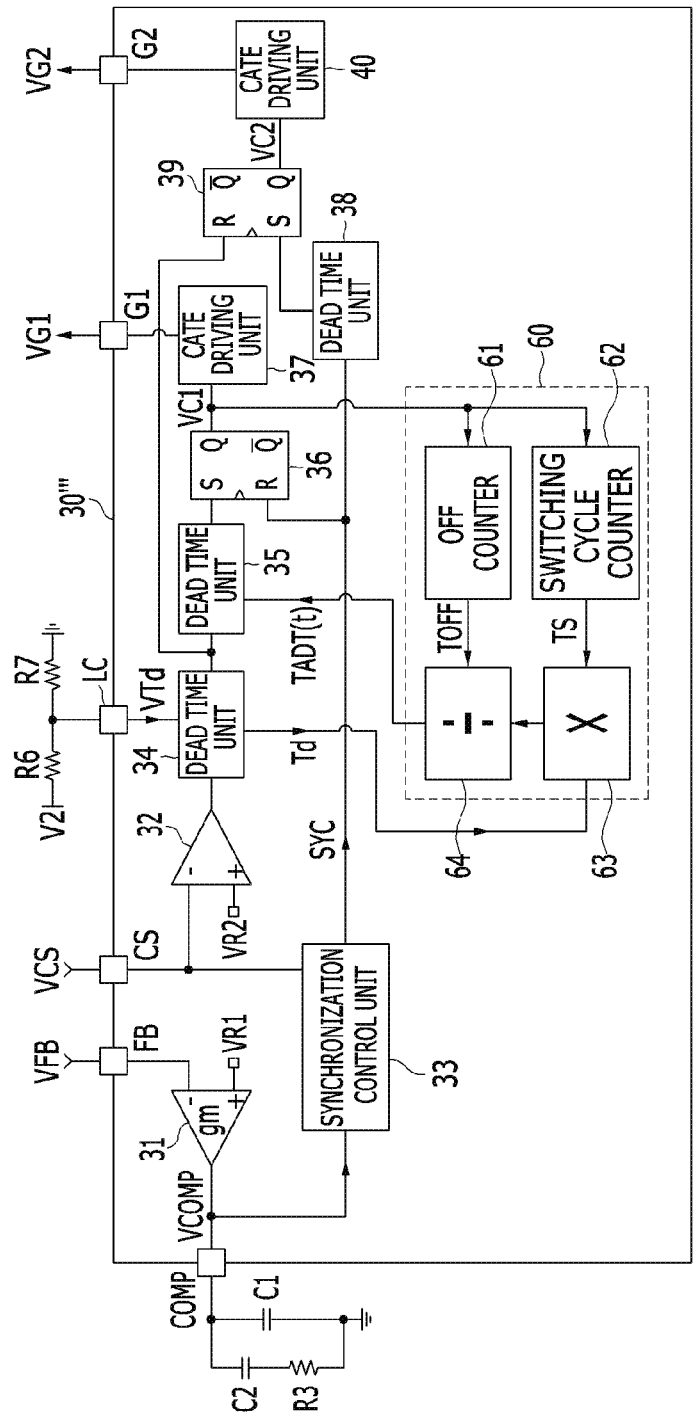
FIG. 8 is a diagram showing a switch control circuit according to still another embodiment.

FIG. 8 is a diagram showing a switch control circuit according to still another embodiment.

The same reference numerals are used for the same elements as those in the above-described embodiment, and descriptions thereof will be omitted.

As shown in FIG. 8, a delay unit 42 of a switch control circuit 30''' is connected to the pin LC. The zero voltage delay time TZVS(t) may be calculated on the basis of a voltage VTd that is input from the pin LC.

Then, the delay time Td is transferred to the multiplier 63 of the dead time calculation unit 60 from the delay unit 42.

According to the above embodiments, it is possible to calculate a dead time that changes depending on a zero voltage delay time and an input voltage and perform zero voltage switching.

Although the exemplary embodiments have been described in detail, the scope of the present disclosure is not limited thereto, but modifications and alterations made by those skilled in the art using the basic concept of the present disclosure defined in the following claims fall within the scope of the present disclosure.

The invention claimed is:

1. A switch control circuit comprising:
   a first delay circuit to receive an indicator signal and to produce a turn off signal by delaying the indicator signal by a zero voltage delay time;
   a first dead time circuit to produce a first turn on signal by delaying the turn off signal according to a value of a calculated dead time signal;
   a first gate control circuit to turn on a first gate control signal in response to an assertion of the first turn on signal;
   a second gate control circuit to turn off a second gate control signal in response to an assertion of the turn off signal;
   a first counter to produce an off time signal having a value corresponding to an off time of the first gate control signal;
   a second counter to produce a duration signal having a value corresponding to an on time of the first gate control signal or a cycle time of the first gate control signal;
   a dead time calculation circuit to produce the calculated dead time signal based on the off time signal, the duration signal, and a delay time value.

2. The switch control circuit of claim 1, wherein the dead time calculation circuit is to multiply a value of the duration signal by the delay time value to produce a product signal; and divide a value of the product signal by the value of the off time signal to produce the calculated dead time signal.

3. The switch control circuit of claim 1, further comprising:
   a second dead time circuit to receive a synchronization signal and generate a second turn on signal by delaying the synchronization signal by a predetermined dead time,
   wherein the first gate control circuit is to turn off the first gate control signal in response to an assertion of the synchronization signal, and
   wherein the second gate control circuit is to turn on the second gate control signal in response to an assertion of the second turn on signal.

4. The switch control circuit of claim 1,
   wherein the delay time value corresponds to the zero voltage delay time, and
   wherein the second counter produces the duration signal having the value corresponding to the on time of the first gate control signal.

5. The switch control circuit of claim 1, further comprising:
   a comparator circuit, to produce the indicator signal by comparing a detection voltage signal to a reference signal.

6. A switch control circuit comprising:
   a dead time calculation circuit to receive a delay time value, determine an off time value corresponding to an off time of a first gate control signal, determine a duration value corresponding to one of an on time of the first gate control signal or a cycle time of the first gate control signal, and produce a calculated dead time signal based on the off time value, the duration value, and the delay time value;
   a first dead time circuit to produce a first turn on signal by delaying a turn off signal according to a value of the calculated dead time signal;
   a first gate control circuit to turn on the first gate control signal in response to an assertion of the first turn on signal; and
   a second gate control circuit to turn off a second gate control signal in response to an assertion of the turn off signal.

7. The switch control circuit of claim 6, wherein the dead time calculation circuit is to multiply the duration value by the delay time value to produce a product value; and divide the product value by the off time value to produce the value of the calculated dead time signal.

8. The switch control circuit of claim 6, further comprising:
   a second dead time circuit to receive a synchronization signal and generate a second turn on signal by delaying the synchronization signal by a predetermined dead time,
   wherein the first gate control circuit is to turn off the first gate control signal in response to an assertion of the synchronization signal, and
   wherein the second gate control circuit is to turn on the second gate control signal in response to an assertion of the second turn on signal.

9. The switch control circuit of claim 6, further comprising:
   a delay circuit to produce the turn off signal by delaying an indicator signal by a zero voltage delay time.

10. The switch control circuit of claim 9, wherein the delay time value is equal to the zero voltage delay time.

11. The switch control circuit of claim 6, wherein the duration value corresponds to the on time of the first gate control signal.

12. The switch control circuit of claim 6, further comprising:
    a comparator circuit, to produce the indicator signal by comparing a detection voltage signal to a reference signal.

13. A switch control method, comprising:
    determining, by a dead time calculation circuit, an off time value corresponding to an off time of a first gate control signal;
    determining, by the dead time calculation circuit, a duration value corresponding to one of an on time of the first gate control signal or a cycle time of the first gate control signal;
    producing, by the dead time calculation circuit, a calculated dead time signal based on the off time value, the duration value, and a delay time value;
    producing, by a first dead time circuit, a first turn on signal by delaying a turn off signal according to a value of the calculated dead time signal;
    turning on, by a first gate control circuit, the first gate control signal in response to an assertion of the first turn on signal; and
    turning off, by a second gate control circuit, a second gate control signal in response to an assertion of the turn off signal.

14. The switch control method of claim 13, wherein producing the calculated dead time signal comprises:
    multiplying the duration value by the delay time value to produce a product value; and
    dividing the product value by the off time value to produce the value of the calculated dead time signal.

15. The switch control method of claim 13, further comprising:

generating, by a second dead time circuit, a second turn on signal by delaying a synchronization signal by a predetermined dead time;

turning off, by the first gate control circuit, the first gate control signal in response to an assertion of the synchronization signal, and turning on, by the second gate control circuit, the second gate control signal in response to an assertion of the second turn on signal.

16. The switch control method of claim 13, further comprising:

producing, by a delay circuit, the turn off signal by delaying an indicator signal by a zero voltage delay time.

17. The switch control method of claim 16, wherein the delay time value is equal to the zero voltage delay time.

18. The switch control method of claim 16, further comprising:

producing, by a comparator circuit, the indicator signal by comparing a detection voltage signal to a reference signal.

\* \* \* \* \*